United States Patent
Ota

(10) Patent No.: US 11,601,114 B2
(45) Date of Patent: Mar. 7, 2023

(54) SURFACE ACOUSTIC WAVE DEVICE AND SURFACE ACOUSTIC WAVE FILTER

(71) Applicant: Murata Manufacturing Co., Ltd., Nagaokakyo (JP)

(72) Inventor: Noriyoshi Ota, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 931 days.

(21) Appl. No.: 16/445,265

(22) Filed: Jun. 19, 2019

(65) Prior Publication Data

US 2019/0305746 A1 Oct. 3, 2019

Related U.S. Application Data

(63) Continuation of application No. PCT/JP2017/045759, filed on Dec. 20, 2017.

(30) Foreign Application Priority Data

Dec. 26, 2016 (JP) .............................. JP2016-251332

(51) Int. Cl.
*H03H 9/64* (2006.01)
*H03H 9/02* (2006.01)
*H03H 9/145* (2006.01)

(52) U.S. Cl.
CPC ...... *H03H 9/6483* (2013.01); *H03H 9/02574* (2013.01); *H03H 9/14538* (2013.01);
(Continued)

(58) Field of Classification Search
CPC .. H03H 9/02574; H03H 9/14538; H03H 9/64; H03H 9/643; H03H 9/6433;
(Continued)

(56) References Cited

U.S. PATENT DOCUMENTS

2003/0160664 A1  8/2003 Beaudin et al.
2008/0018417 A1  1/2008 Igaki et al.
(Continued)

FOREIGN PATENT DOCUMENTS

JP  2001-156588 A  6/2001
JP  2003-332884 A  11/2003
(Continued)

OTHER PUBLICATIONS

Official Communication issued in International Patent Application No. PCT/JP2017/045759, dated Feb. 27, 2018.

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

A surface acoustic wave filter includes series and parallel arm resonance sections. The series arm resonance section is in a series arm. The parallel arm resonance section is in a parallel arm. The series arm resonance section includes one or more surface acoustic wave devices. Each surface acoustic wave device includes a first resonator group and a second resonator group. The first and second resonator groups are connected in parallel and include surface acoustic wave resonators. The first resonator group includes at least one surface acoustic wave resonator. The second resonator group includes a greater number of surface acoustic wave resonators than the at least one surface acoustic wave resonator in the first resonator group. The resonant frequency of the surface acoustic wave resonator in the first resonator group is higher than the resonant frequency of the surface acoustic wave resonators in the second resonator group.

12 Claims, 7 Drawing Sheets

(52) U.S. Cl.
CPC ............. *H03H 9/64* (2013.01); *H03H 9/643* (2013.01); *H03H 9/6433* (2013.01)

(58) Field of Classification Search
CPC ........... H03H 9/02834; H03H 9/02929; H03H 9/6426; H03H 9/6483
USPC .......................................... 333/133, 193–196
See application file for complete search history.

(56) References Cited

U.S. PATENT DOCUMENTS

| | | |
|---|---|---|
| 2010/0109801 A1 | 5/2010 | Inoue et al. |
| 2010/0148887 A1* | 6/2010 | Matsuda .............. H03H 9/6483 333/133 |

FOREIGN PATENT DOCUMENTS

| | | |
|---|---|---|
| JP | 2010-109894 A | 5/2010 |
| WO | 03/069777 A1 | 8/2003 |
| WO | 2005/107069 A1 | 11/2005 |

* cited by examiner

COMBINED CAPACITANCE: C
AREA: 4 TIMES

COMBINED CAPACITANCE: C
AREA: 2.5 TIMES

COMBINED CAPACITANCE: C
AREA: 3 TIMES

COMBINED CAPACITANCE: C
AREA: 9 TIMES

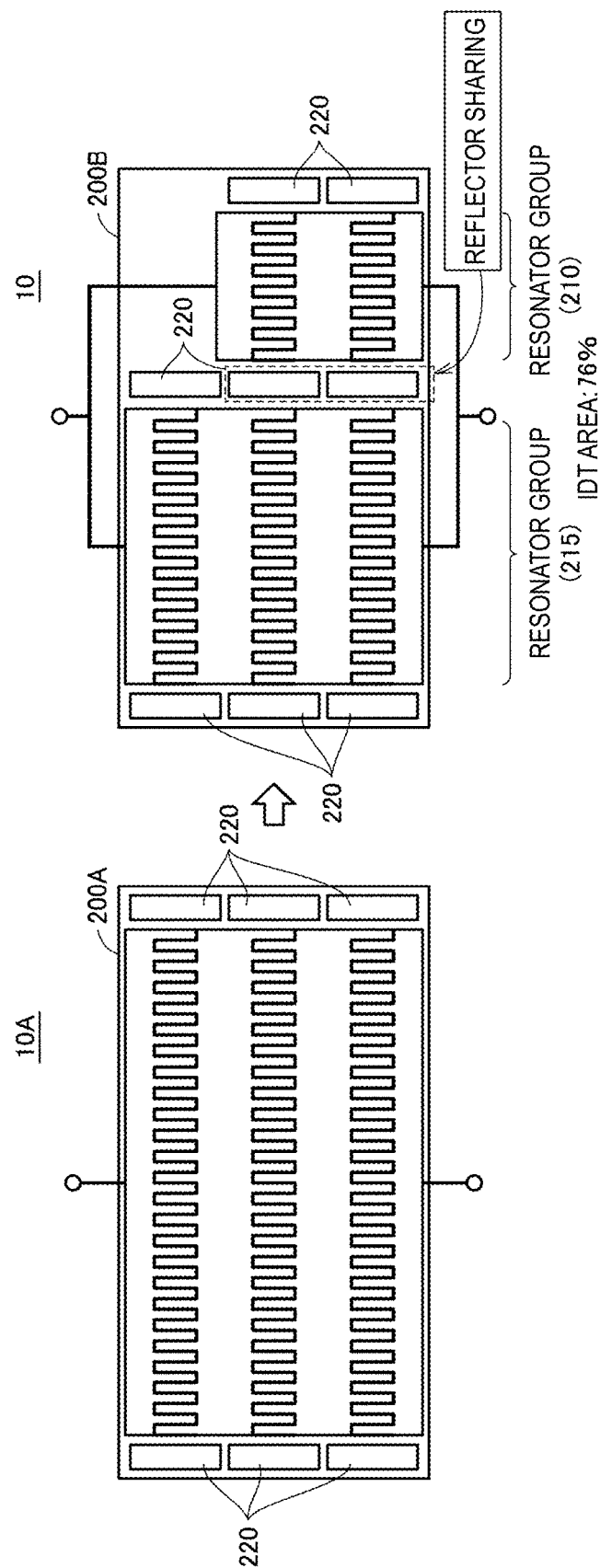

SURFACE ACOUSTIC WAVE DEVICE AND SURFACE ACOUSTIC WAVE FILTER

CROSS REFERENCE TO RELATED APPLICATIONS

This application claims the benefit of priority to Japanese Patent Application No. 2016-251332 filed on Dec. 26, 2016 and is a Continuation Application of PCT Application No. PCT/JP2017/045759 filed on Dec. 20, 2017. The entire contents of each application are hereby incorporated herein by reference.

BACKGROUND OF THE INVENTION

1. Field of the Invention

The present invention relates to a surface acoustic wave device and, more specifically, to technology for improving the electric power handling capability of a surface acoustic wave device used for a ladder surface acoustic wave filter including series arm resonators and parallel resonators.

2. Description of the Related Art

A surface acoustic wave filter in a ladder type configuration is known. In the ladder type configuration, a plurality of surface acoustic wave (SAW) resonators are alternately disposed in series arms and parallel arms. The surface acoustic wave resonator has a schematic configuration in which pairs of comb-shaped electrodes (IDTs: Inter Digital Transducers) are disposed on a piezoelectric substrate formed from a piezoelectric single crystal, such as lithium tantalate ($LiTaO_3$) or lithium niobate ($LiNbO_3$) or from piezoelectric ceramics. The pairs of comb-shaped electrodes are formed using an electrode material, such as an elemental metal formed from at least one of, for example, aluminum, copper, silver, gold, titanium, tangusten, platinum, chromium, nickel, and molybdenum or an alloy having a chief ingredient that is one of these metals. Note that a piezoelectric substrate including piezoelectric films stacked on the supporting substrate may also be used.

In surface acoustic wave filters, a high frequency, a high band, and high output in a drive frequency and a pass band, together with the downsizing of a filter itself, are desired in recent years. To achieve a high frequency, the pitch of the electrode fingers of an IDT electrode and the electrode wiring width need to be small. In contrast, to achieve high output, an output signal needs higher power than in the related art.

Providing small IDT electrodes and high power causes electrical and mechanical stresses due to the high power and a piezoelectric effect to occur on resonators. The characteristics of surface acoustic wave resonators are thus likely to be deteriorated, or electrode fingers are likely to be damaged or destroyed.

To solve such problems, Japanese Unexamined Patent Application Publication No. 2001-156588 discloses a configuration of a ladder surface acoustic wave filter in which a plurality of resonators are connected in series in the series arm resonator that is closest to the signal input terminal and to which relatively high power is applied.

The configuration in Japanese Unexamined Patent Application Publication No. 2001-156588 enables power applied to individual IDT electrodes to be distributed, and thus, the electric power handling capability thereof is able to be improved.

Meanwhile, assume that a resonator is divided in series. To obtain impedance equal to the impedance before the division, the electrostatic capacitance of individual IDT electrodes needs to have a value proportional to the number of division stages. For example, in two-stage division, the capacitance of each resonator needs to be doubled. In three-stage division, the capacitance of each resonator needs to be tripled.

In addition, the area of the IDT electrodes increases in proportion to the total capacitance obtained by adding up the electrostatic capacitances of the individual IDT electrodes. The area of the IDT electrodes on the piezoelectric substrate thus increases in proportion to the square of the number of division stages. For example, in the case of two-stage division, the area of the IDT electrodes increases by four times. In the case of three-stage division, the area of the IDT electrodes increases by nine times. This is disadvantageous from the viewpoint of filter downsizing. In other words, in series division of a resonator, electric power handling capability improvement and downsizing are likely to have a trade-off relationship.

SUMMARY OF THE INVENTION

Preferred embodiments of the present invention reduce or prevent an excessive increase in the resonator size of a surface acoustic wave device and improve the electric power handling capability of the surface acoustic wave device.

A surface acoustic wave device according to a preferred embodiment of the present invention includes a piezoelectric substrate, at least a first resonator group, and at least a second resonator group. The first resonator group and the second resonator group are connected in parallel to each other and are defined by surface acoustic wave resonators each including an IDT electrode provided on the piezoelectric substrate. The first resonator group includes at least one surface acoustic wave resonator. The second resonator group includes a greater number of surface acoustic wave resonators than the at least one surface acoustic wave resonator in the first resonator group, and the surface acoustic wave resonators are connected in series. The resonant frequency of the surface acoustic wave resonator in the first resonator group is higher than the resonant frequency of the surface acoustic wave resonators in the second resonator group.

In a surface acoustic wave device according to a preferred embodiment of the present invention, the surface acoustic wave resonators in the first resonator group and the second resonator group preferably include reflectors. On the piezoelectric substrate, at least one of the reflectors for the surface acoustic wave resonator in the first resonator group is used as one of the reflectors for the surface acoustic wave resonators in the second resonator group.

In a surface acoustic wave device according to a preferred embodiment of the present invention, the combined capacitance of the first resonator group is preferably equal or substantially equal to the combined capacitance of the second resonator group.

In a surface acoustic wave device according to a preferred embodiment of the present invention, the combined capacitance of the first resonator group is preferably different from the combined capacitance of the second resonator group.

In a surface acoustic wave device according to a preferred embodiment of the present invention, the surface acoustic wave device preferably further includes a third resonator group connected in parallel to the first resonator group and the second resonator group. The third resonator group includes a greater number of surface acoustic wave resonators than the at least one surface acoustic wave resonator in the first resonator group. The surface acoustic wave resonators in the third resonator group are connected in series. The resonant frequency of the surface acoustic wave resonator in the first resonator group is higher than the resonant frequency of the surface acoustic wave resonators in the third resonator group.

A surface acoustic wave filter according to a preferred embodiment of the present invention has a ladder configuration including a series arm resonance section and a parallel arm resonance section. The series arm resonance section is disposed in a series arm provided between an input terminal and an output terminal. The parallel arm resonance section is disposed in a parallel arm connected between the series arm and a ground potential. The series arm resonance section is defined by a surface acoustic wave device according to a preferred embodiment of the present invention.

A surface acoustic wave filter according to a preferred embodiment of the present invention preferably further includes a different series arm resonance section disposed in the series arm. In the series arm, the series arm resonance section is located closer to the input terminal than the different series arm resonance section is.

Preferred embodiments of the present invention provide surface acoustic wave devices that each enable electric power handling capability to be improved and an increase in resonator size to be reduced or prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 10A and 10B are diagrams for explaining a different example of the layout of the surface acoustic wave resonators on the piezoelectric substrate.

DETAILED DESCRIPTION OF THE PREFERRED EMBODIMENTS

Figure 1:
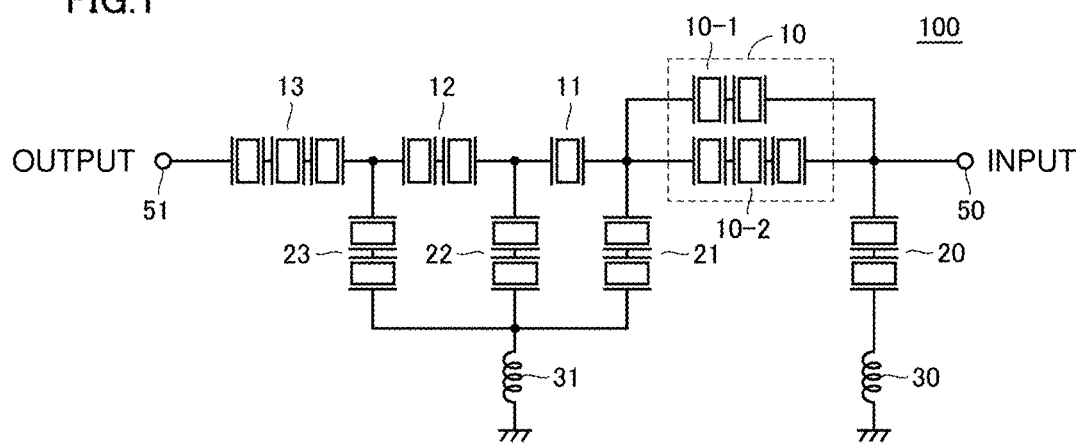
FIG. 1 is a circuit diagram illustrating a surface acoustic wave filter according to a preferred embodiment of the present invention.

Hereinafter, preferred embodiments of the present invention will be described in detail with reference to the drawings. Note that the same or equivalent components in the figures are denoted by the same reference numerals, and description thereof is not repeated.

FIG. 1 is a circuit diagram illustrating an example of a surface acoustic wave filter 100 according to a preferred embodiment of the present invention. With reference to FIG. 1, the surface acoustic wave filter 100 has a ladder configuration including series arm resonance sections 10 to 13 and parallel arm resonance sections 20 to 23. The series arm resonance sections 10 to 13 are connected in series in a series arm provided between an input terminal 50 and an output terminal 51. The parallel arm resonance sections 20 to 23 are each provided in a parallel arm connected between the series arm and a ground potential. Each resonance section includes one or more surface acoustic wave devices, and each surface acoustic wave device includes a resonator group including one or more surface acoustic wave resonators. The surface acoustic wave resonators include a piezoelectric substrate and IDT electrodes provided on the piezoelectric substrate as described later with reference to FIGS. 9A and 9B.

The parallel arm resonance section 20 includes one end connected to the input terminal 50 and the other end connected to a ground potential with an inductor 30 interposed therebetween. The parallel arm resonance section 21 includes one end connected to the connection node between the series arm resonance section 10 and the series arm resonance section 11 and the other end connected to a ground potential with an inductor 31 interposed therebetween. The parallel arm resonance section 22 includes one end connected to the connection node between the series arm resonance section 11 and the series arm resonance section 12 and the other end connected to a ground potential with the inductor 31 interposed therebetween. The parallel arm resonance section 23 includes one end connected to the connection node between the series arm resonance section 12 and the series arm resonance section 13 and the other end connected to a ground potential with the inductor 31 interposed therebetween.

Note that the number of series arm resonance sections, the number of parallel arm resonance sections, and the number of surface acoustic wave resonators in each resonator group are examples and are appropriately designed in accordance with the characteristics of a filter.

In the present preferred embodiment, the series arm resonance section 10 closest to the input terminal 50 includes a first resonator group 10-1 and a second resonator group 10-2 that are connected in parallel between the input terminal 50 and the series arm resonance section 11. In the example in FIG. 1, preferably, the first resonator group 10-1 includes two surface acoustic wave resonators connected in series, and the second resonator group 10-2 includes three surface acoustic wave resonators connected in series, for example.

Figure 2:
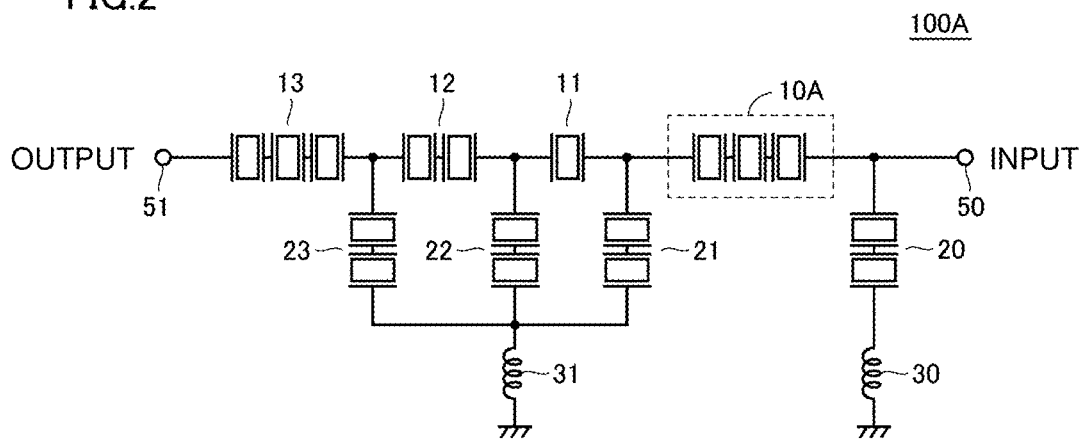
FIG. 2 is a circuit diagram illustrating a surface acoustic wave filter in a comparative example.

FIG. 2 is a circuit diagram illustrating a surface acoustic wave filter 100A in a comparative example. The surface acoustic wave filter 100A has a configuration in which the series arm resonance section 10 in FIG. 1 is replaced with a series arm resonance section 10A, and the layout of the other components is the same or substantially the same as that in FIG. 1. The series arm resonance section 10A has a configuration in which three surface acoustic wave resonators are connected in series.

Such a ladder surface acoustic wave filter as illustrated in FIG. 1 or FIG. 2 may be used for, for example, a communication device, such as a mobile phone. In recent years, high output of a transmission signal is desired to ensure a long reception distance. In addition, the electric power handling capability of the surface acoustic wave filter needs to be improved.

In particular, in the ladder surface acoustic wave filter, power applied to the series arm resonance sections 10A or 10 first receiving a signal input from the input terminal 50 tends to increase. Accordingly, as in the series arm resonance section 10A in the comparative example in FIG. 2, the series division configuration in which a plurality of surface acoustic wave resonators are connected in series enables power consumed in the individual resonators (IDT electrodes) to be reduced and the electric power handling capability to be improved.

Figure 3:
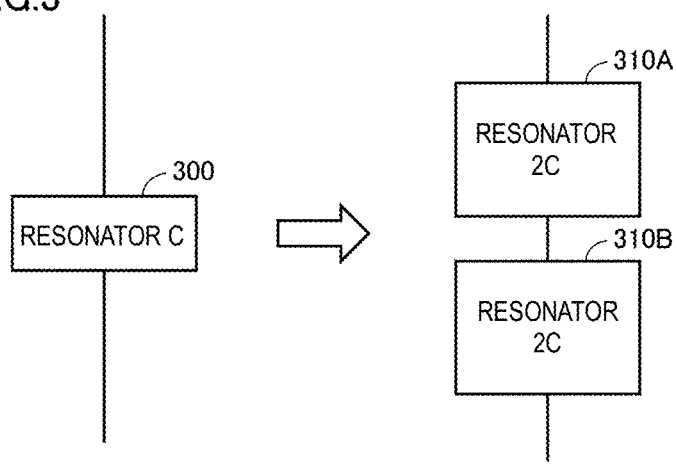
FIG. 3 is a diagram illustrating a series arm resonance section in a comparative example.

However, to ensure the same impedance before the division when simply dividing the resonators in series, the electrostatic capacitance (hereinafter, also simply referred to as "capacitance") of each resonator after the division needs to be the number of divisions times the electrostatic capacitance of a resonator before the division. For example, as illustrated in FIG. 3, a case in which the capacitance of a resonator 300 before the division is C. To obtain C of the combined capacitance after division into two, the capacitance of each of resonators 310A and 310B after the division needs to be 2C.

Generally, the area of resonators on the piezoelectric substrate is proportional to the capacitance of the resonators. Division into the two resonators 310A and 310B thus leads to two resonators having twice as high capacitance as before. Consequently, the resonators occupy four times the area as before the division. Accordingly, space on the piezoelectric substrate is needed, and it is, thus, disadvantageous from the viewpoint of downsizing a filter.

In the present preferred embodiment, as illustrated in FIG. 1, the series arm resonance section 10 includes the two parallel connected resonator groups 10-1 and 10-2. Further, at least one of the resonator groups is divided in series. As described above, by performing the parallel division, the combined capacitance needed for each resonator group is decreased. An increase in the area needed for the resonators on the piezoelectric substrate is able to be reduced or prevented. In addition, by dividing each resonator group in series, power consumed in each surface acoustic wave resonator is able to be reduced.

At this time, if each parallel divided resonator group is divided into the same number of series arm resonators, the division results in the same total capacitance as that in the case of not performing the parallel division, and thus, does not enable the area reduction. Accordingly, in the present preferred embodiment, at least one of the parallel divided resonator groups (also referred to as a "first resonator group") is divided in series by a smaller number than that for the other resonator group (also referred to as a "second resonator group"), and thus an increase of the area on the piezoelectric substrate is reduced or prevented.

Figure 4:
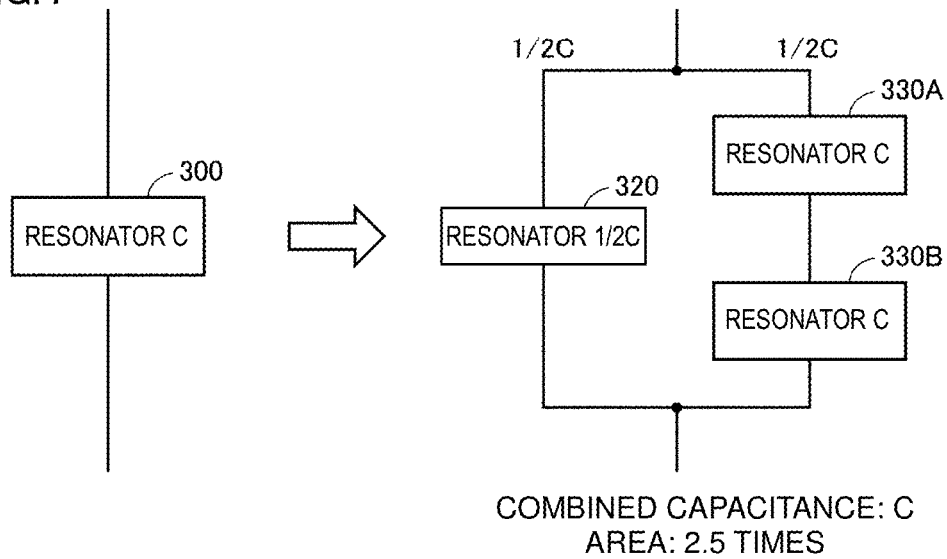
FIG. 4 is a diagram illustrating a series arm resonance section according to a preferred embodiment of the present invention.

Specifically, as illustrated in FIG. 4, when the capacitance of a resonator 300 yet to be divided is C, one of the divided resonator groups (first resonator group) includes a resonator 320 having capacitance of C/2, and the other resonator group (second resonator group) includes two resonators 330A and 330B each having capacitance of C and connected in series.

In this case, the combined capacitance of each resonator group is C/2. The total combined capacitance is C and, thus, has an impedance unchanged from an impedance before the division.

In contrast, the total capacitance after the division is about 5C/2, the area of the resonators on the piezoelectric substrate is thus about 2.5 times as large as that before the division. As described above, by performing both the parallel division and the series division, and by making the number of series divisions for at least one of the parallel connected resonator groups smaller than the number of series divisions for the other resonator group in series, the impedance before the division (combined capacitance) is able to be maintained, and the area needed for the resonators on the piezoelectric substrate is also able to be reduced compared with the case of only the series division as in FIG. 3 (four times).

However, the first resonator group divided in series by a smaller number as in FIG. 4 has low power applied thereto but also has a smaller area on the piezoelectric substrate. The electric power handling capability of the resonance section depends on the resonator group (first resonator group) divided in series by the smaller number. Thus, in the present preferred embodiment, the resonant frequency of the surface acoustic wave resonator in the resonator group (first resonator group) divided in series by the smaller number is set higher than the resonant frequency of the surface acoustic wave resonators in the resonator group (second resonator group) divided in series by a larger number.

Figure 5:
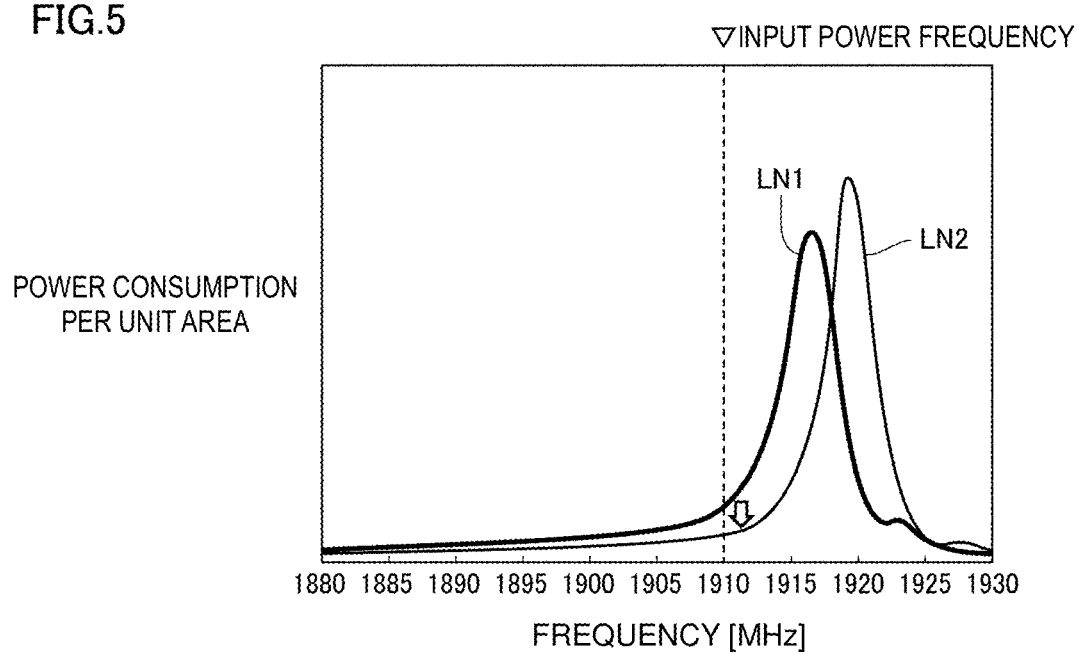
FIG. 5 is a diagram for explaining a relationship between the resonant frequency of a surface acoustic wave resonator and power consumption.

FIG. 5 is a diagram for explaining a relationship between the resonant frequency of a surface acoustic wave resonator and the power consumption thereof. In FIG. 5, the horizontal axis represents frequency, and the vertical axis represents power consumption per unit area of the surface acoustic wave resonator. In FIG. 5, a curve LN1 represents power consumed when the resonant frequency of the surface acoustic wave resonator is, for example, f0, and a curve LN2 represents power consumed when the resonant frequency of the surface acoustic wave resonator is set at a higher resonant frequency (f0+5 MHz, for example) than f0. As understood from FIG. 5, power with a frequency of, for example, about 1910 MHz is input to the surface acoustic wave resonator, and at the frequency for the input power, power consumption involved with the resonant frequency set higher is lower than the power consumption involved with the resonant frequency set lower.

Based on the characteristics as described above, the resonant frequency of surface acoustic wave resonators in a resonator group divided in series by a smaller number (first resonator group) is set higher than the resonant frequency of surface acoustic wave resonators in a resonator group divided in series by a larger number (second resonator group), and thus the power consumption of the resonators in the same area is able to be reduced. This enables the electric power handling capability of the resonator group divided in series by the smaller number (first resonator group) to be improved.

Note that the resonant frequency of the surface acoustic wave resonators is able to be increased by decreasing the duty ratio of the IDT electrodes (that is, decreasing the wiring width) or by decreasing the distance of electrode finger spacing (pitch), for example.

Figure 6:
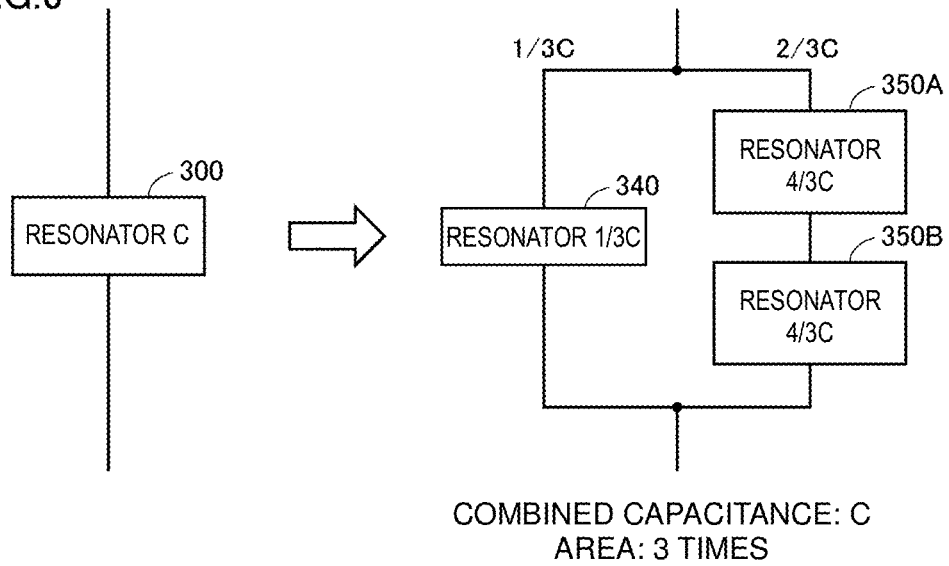
FIG. 6 is a diagram illustrating a first modification of the series arm resonance section according to a preferred embodiment of the present invention.

FIG. 6 is a diagram illustrating a first modification of the present preferred embodiment. The above-described example in FIG. 4 illustrates the example in which the combined capacitance of each parallel divided resonator group is equal or substantially equal, but the combined capacitance of each parallel divided resonator group does not necessarily have to be the same or substantially the same. The modification in FIG. 6 illustrates an example in which the capacitance of one of the divided resonator group (a resonator 340) is preferably set at C/3 and the combined capacitance of the other resonator group (resonators 350A and 350B) is preferably set at 2C/3.

In this case, the total combined capacitance is C, and the impedance does not change from that before the division. However, the total capacitance is about 9C/3 (=about 3C), and thus the area of the resonators on the piezoelectric substrate is about three times as large as the area before the division. Although the resonator area on the piezoelectric substrate is larger than that in the case of equally dividing in FIG. 4, the area is able to be smaller than that in the case of not dividing (four times). The larger area than that in the case of equally dividing provides improved electric power handling capability compared with that in the case of equally dividing.

As described above, the ratio of the combined capacitance of the parallel divided resonator groups is controlled, and thus the balance between the filter size and the electric power handling capability is able to be controlled to have a desired value.

Figure 7:
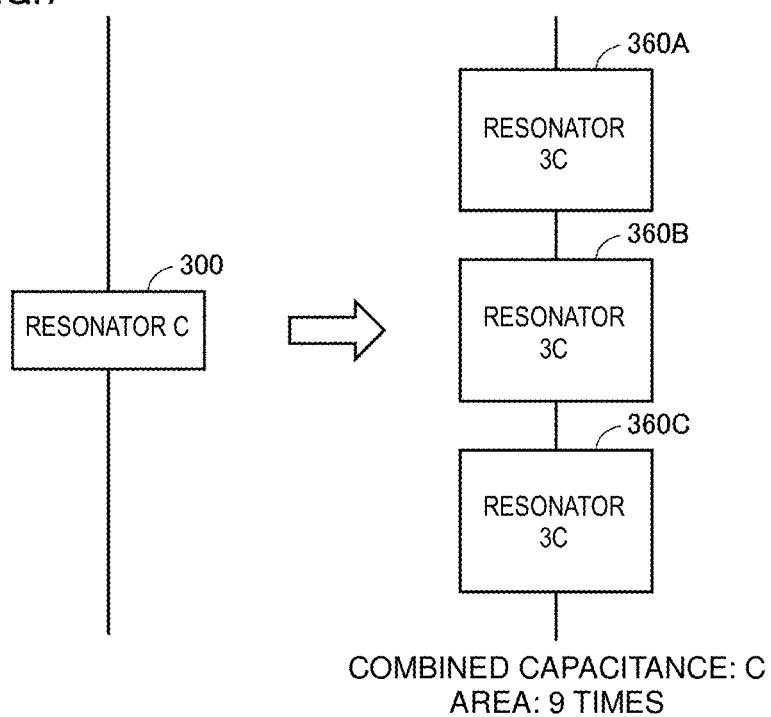
FIG. 7 is a diagram illustrating a series arm resonance section in a different comparative example.

For a second modification of the present preferred embodiment, an example in which the number of series divisions is will be described. FIG. 7 is a diagram illustrating a comparative example in which the resonator 300 having the capacitance of C is divided in series into resonators 360A, 360B, and 360C in three stages. In this case, to obtain the same impedance as before the division, the capacitance of each of the resonators 360A, 360B, and 360C needs to be 3C. Increasing series stages for the division to the three stages enables power consumption in each divided resonator to be lower than that in the case of two-stage division and, thus, the electric power handling capability to be improved. However, the total capacitance after the division is 9C, and thus the area needed on the piezoelectric substrate increases by about nine times.

Figure 8:
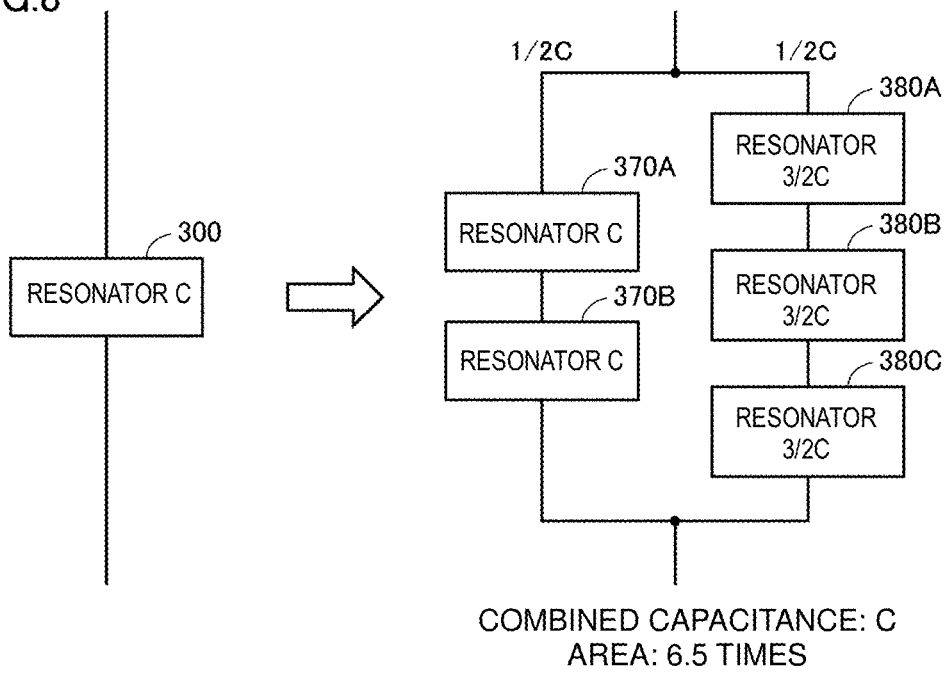
FIG. 8 is a diagram illustrating a second modification of the series arm resonance section according to a preferred embodiment of the present invention.

FIG. 8 is a diagram illustrating an example in which the number of parallel stages is 2, one of the resonator groups is includes resonators 370A and 370B resulting from division into two stages in series, and the other resonator group includes resonators 380A, 380B, and 380C resulting from division into three stages in series.

In FIG. 8, the division is performed equally to cause each parallel divided resonator group to have combined capacitance of C/2. Accordingly, the capacitance of each of the resonators 370A and 370B is set at C, and the capacitance of each of the resonators 380A, 380B, and 380C is set at about 2C/3. This provides a total capacitance of about 13C/2, and thus the area of the surface acoustic wave resonators on the piezoelectric substrate is about 6.5 times as large as that before the division. Accordingly, the area is able to be reduced compared with the area in the case of the series division in FIG. 7 (nine times).

Note that also in this case, as described with reference to FIG. 5, the resonant frequency for the resonators 370A and 370B divided in series by a smaller number is higher than that for the resonators 380A, 380B, and 380C, and the power consumption of the resonators 370A and 370B is reduced. The electric power handling capability is thus ensured.

Here, the layout of surface acoustic wave resonators on the piezoelectric substrate in the second modification will be described by using FIGS. 9A and 9B.

Figures 9A, 9B:
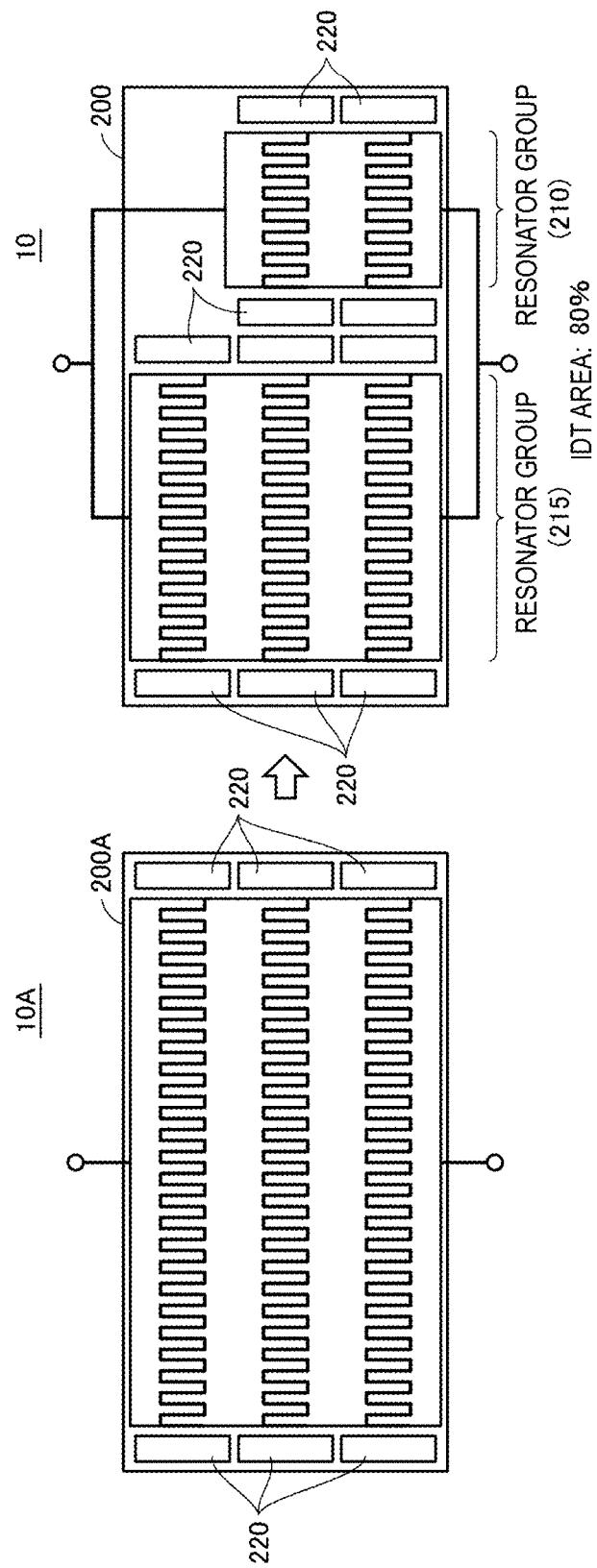
FIGS. 9A and 9B are diagrams for explaining the layout of surface acoustic wave resonators on the piezoelectric substrate.

FIG. 9A is a layout of surface acoustic wave resonators in the case in which the surface acoustic wave resonators are divided in series into three stages, as described with reference to FIG. 7. FIG. 9B is a layout of surface acoustic wave resonators parallel divided as a resonator group 210 divided in series into two stages and a resonator group 215 divided in series into three stages, as described with reference to FIG. 8.

The series arm resonance section 10A in FIG. 9A includes three IDT electrodes connected in series on a piezoelectric substrate 200A, and a reflector 220 provided on each end of each IDT electrode. In FIG. 9A, the capacitance of each IDT electrode is 3C.

In a case in which parallel division is performed on this as in FIG. 9B, the capacitance of each IDT electrode of the two-stage resonator group 210 is C, and thus the entire IDT electrode is about ⅓ as wide as in the case in FIG. 9A. In addition, the capacitance of each IDT electrode of the three-stage resonator group 215 is about 3C/2, and thus the entire IDT electrode is about ½ as wide as in FIG. 9A. Note that since the reflector 220 is provided at each end of the IDT electrode, the area ratio of the case of FIG. 9B to the case of FIG. 9A is not simply (6.5)/9. In the cases in FIGS. 9A and 9B, the area in the case of FIG. 9B after the parallel division is about 80% of the area in FIG. 9A in only the series division.

FIGS. 10A and 10B is a diagram illustrating the layout of surface acoustic wave resonators to further reduce the area from that in FIGS. 9A and 9B. In FIGS. 10A and 10B, on a piezoelectric substrate 200B, some of the reflectors for the two-stage resonator group 210 are used as some of the reflectors for the three-stage resonator group 215, and thus the total area is reduced. In the cases in FIGS. 10A and 10B, FIG. 10B is about 76% of the area in FIG. 10A.

As described above, increasing the number of divisions leads to a smaller area of the IDT electrodes itself, whereas a resultant increase of the number of reflectors requires an area for the reflectors. Accordingly, attention needs to be paid because excessively increasing the number of divisions is likely to cause an increase of the area needed on the piezoelectric substrate.

Figure 11:
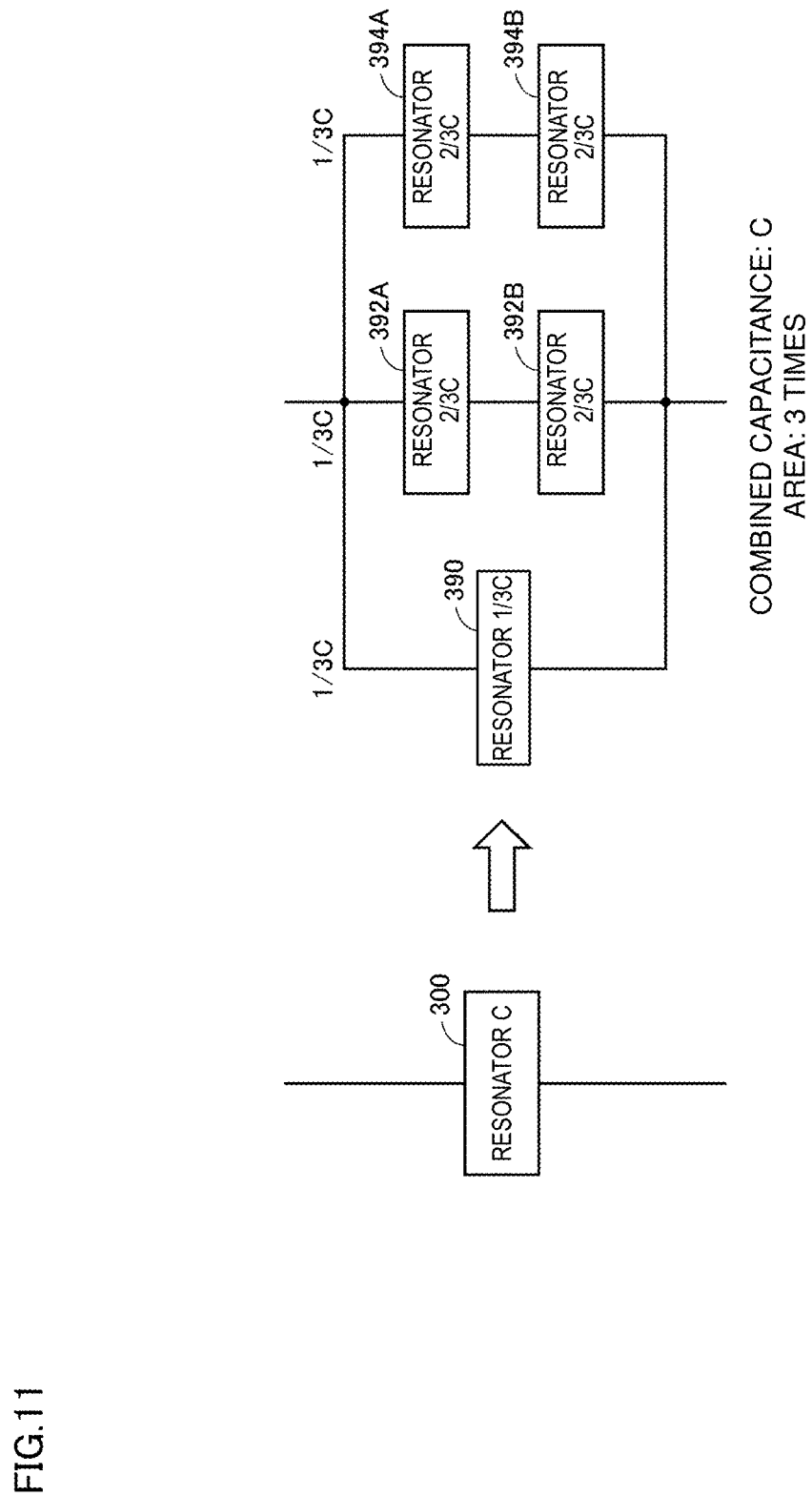
FIG. 11 is a diagram illustrating a third modification of the series arm resonance section according to a preferred embodiment of the present invention.

In the aforementioned preferred embodiment, the cases in which the number of parallel divisions is 2 have been described. However, the number of parallel divisions may be 3 or more. FIG. 11 is a diagram illustrating series arm resonators according to a third modification of the present preferred embodiment.

In the series arm resonance section in FIG. 11, a resonator group (first resonator group) including one resonator 390, a resonator group (second resonator group) including resonators 392A and 392B connected in series in two stages, and a resonator group (third resonator group) including resonators 394A and 394B connected in series in two stages are connected in parallel.

In the example in FIG. 11, division is performed equally such that each resonator group to have combined capacitance of about C/3. The capacitance of a resonator 390 in the first resonator group is about C/3, the capacitance of each of the resonators 392A and 392B in the second resonator group is about 2C/3, and the capacitance of each of the resonators 394A and 394B in the third resonator group is about 2C/3. Accordingly, the total capacitance of all of the resonators is tripled, and the area of the surface acoustic wave resonators on the piezoelectric substrate is three times as large as that before the division.

Also in the example in FIG. 11, the resonant frequency of the resonator 390 divided in series by a smaller number is higher than that of the resonators 392A, 392B, 394A, and 394B in the second and third resonator groups. The electric power handling capability of the resonator 390 divided in series by the smaller number is thus ensured.

Note that the second resonator group and the third resonator group have the same number of series stages and the same capacitance in FIG. 11. However, the second resonator group and the third resonator group may have different resonator configurations.

As described above, by appropriately controlling the number of parallel divisions, the number of series divisions, and the resonant frequencies of the resonators, preferable specifications of the resonator size and the electric power handling capability are able to be achieved.

Note that any of the preferred embodiments and the modifications thereof described above may be appropriately combined together.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave device comprising:
a piezoelectric substrate;
at least a first resonator group; and
at least a second resonator group; wherein
the first resonator group and the second resonator group are connected in parallel to each other and include surface acoustic wave resonators each including an interdigital transducer electrode provided on the piezoelectric substrate;
the first resonator group includes at least one surface acoustic wave resonator;
the second resonator group includes a greater number of surface acoustic wave resonators than the at least one surface acoustic wave resonator in the first resonator group, the surface acoustic wave resonators in the second resonator group being connected in series;
a resonant frequency of the at least one surface acoustic wave resonator in the first resonator group is higher than a resonant frequency of the surface acoustic wave resonators in the second resonator group; and
a combined capacitance of the first resonator group and the second resonator group is equal or substantially equal to a capacitance of an undivided resonator that is equivalent to divided resonator groups including the first and second resonator groups.

2. The surface acoustic wave device according to claim 1, wherein
the surface acoustic wave resonators in the first resonator group and the second resonator group include reflectors; and
on the piezoelectric substrate, at least one of the reflectors in the at least one surface acoustic wave resonator in the first resonator group is used as one of the reflectors for the surface acoustic wave resonators in the second resonator group.

3. The surface acoustic wave device according to claim 1, wherein a combined capacitance of the first resonator group is equal or substantially equal to a combined capacitance of the second resonator group.

4. The surface acoustic wave device according to claim 1, wherein a combined capacitance of the first resonator group is different from a combined capacitance of the second resonator group.

5. The surface acoustic wave device according to claim 1, further comprising:
a third resonator group connected in parallel to the first resonator group and the second resonator group;
the third resonator group includes a greater number of surface acoustic wave resonators than the at least one surface acoustic wave resonator in the first resonator group, the surface acoustic wave resonators in the third resonator group being connected in series; and
the resonant frequency of the at least one surface acoustic wave resonator in the first resonator group is higher than a resonant frequency of the surface acoustic wave resonators in the third resonator group.

6. A surface acoustic wave filter, comprising:
a series arm resonance section; and
a parallel arm resonance section; wherein
the series arm resonance section is disposed in a series arm provided between an input terminal and an output terminal;
the parallel arm resonance section is disposed in a parallel arm connected between the series arm and a ground potential; and
the series arm resonance section includes the surface acoustic wave device according to claim 1.

7. The surface acoustic wave filter according to claim 6, further comprising:
another series arm resonance section disposed in the series arm; wherein
in the series arm, the series arm resonance section is located closer to the input terminal than the another series arm resonance section.

8. The surface acoustic wave filter according to claim 6, wherein the surface acoustic wave filter is a ladder surface acoustic wave filter.

9. The surface acoustic wave filter according to claim 6, wherein
the surface acoustic wave resonators in the first resonator group and the second resonator group include reflectors; and
on the piezoelectric substrate, at least one of the reflectors in the at least one surface acoustic wave resonator in the first resonator group is used as one of the reflectors for the surface acoustic wave resonators in the second resonator group.

10. The surface acoustic wave filter according to claim 6, wherein a combined capacitance of the first resonator group is equal or substantially equal to a combined capacitance of the second resonator group.

11. The surface acoustic wave filter according to claim 6, wherein a combined capacitance of the first resonator group is different from a combined capacitance of the second resonator group.

12. The surface acoustic wave filter according to claim 6, further comprising:
a third resonator group connected in parallel to the first resonator group and the second resonator group;
the third resonator group includes a greater number of surface acoustic wave resonators than the at least one surface acoustic wave resonator in the first resonator group, the surface acoustic wave resonators in the third resonator group being connected in series; and
the resonant frequency of the at least one surface acoustic wave resonator in the first resonator group is higher than a resonant frequency of the surface acoustic wave resonators in the third resonator group.

* * * * *